United States Patent
Cox

(10) Patent No.: US 7,054,769 B2
(45) Date of Patent: May 30, 2006

(54) STATISTICAL METHOD AND APPARATUS FOR MONITORING PARAMETERS IN AN ELECTRIC POWER DISTRIBUTION SYSTEM

(75) Inventor: Roger W. Cox, Oakdale, PA (US)

(73) Assignee: Eaton Corporation, Cleveland, OH (US)

( * ) Notice: Subject to any disclaimer, the term of this patent is extended or adjusted under 35 U.S.C. 154(b) by 7 days.

(21) Appl. No.: 10/859,829

(22) Filed: Jun. 3, 2004

(65) Prior Publication Data

US 2005/0273280 A1 Dec. 8, 2005

(51) Int. Cl.
*G06F 19/00* (2006.01)
(52) U.S. Cl. .................................... 702/60
(58) Field of Classification Search .......... 702/60; 710/100; 701/45; 340/825; 700/286; 280/735; 351/200; 180/273; 382/149; 715/716; 435/6; 341/131

See application file for complete search history.

(56) References Cited

U.S. PATENT DOCUMENTS

| | | |
|---|---|---|
| 5,587,917 A | 12/1996 | Elms |
| 5,600,527 A | 2/1997 | Engel et al. |
| 5,627,718 A | 5/1997 | Engel et al. |
| 5,706,204 A | 1/1998 | Cox et al. |
| 5,825,656 A | 10/1998 | Moore et al. |
| 5,890,097 A | 3/1999 | Cox |
| 5,899,960 A | 5/1999 | Moore et al. |
| 6,005,759 A | 12/1999 | Hart et al. |
| 6,269,316 B1 | 7/2001 | Hubbard et al. |
| 6,374,188 B1 | 4/2002 | Hubbard et al. |
| 6,459,997 B1 | 10/2002 | Andersen |
| 6,611,773 B1 | 8/2003 | Przydatek et al. |
| 2004/0024937 A1* | 2/2004 | Duncan et al. ............. 710/100 |

* cited by examiner

*Primary Examiner*—Michael Nghiem
*Assistant Examiner*—Tung S. Lau
(74) *Attorney, Agent, or Firm*—Martin J. Moran

(57) ABSTRACT

Dynamic thresholds statistically derived are used to define normal conditions at a specific site in an electric power distribution system. High and low and/or caution and alarm thresholds for various parameters are generated as multiples of the standard deviation of the long-term average of measured values calculated from samples gathered over repetitive intervals, such as ten minutes. Weekly averages are used until sufficient data has been gathered to maintain a running one year average.

4 Claims, 5 Drawing Sheets

STATISTICAL METHOD AND APPARATUS
FOR MONITORING PARAMETERS IN AN
ELECTRIC POWER DISTRIBUTION
SYSTEM

BACKGROUND OF THE INVENTION

1. Field of the Invention

The invention relates to a method and apparatus for monitoring the performance of an electric power distribution system, and in accordance with aspects of the invention, defining normal ranges unique to a specific system for selected parameters through the generation of statistically derived parameter thresholds.

2. Background Information

Numerous methods and systems have been developed to measure and capture power quality events in electric power distribution systems. However, the state of the art systems and methods lack the means for informing the user whether the existing power quality is normal. For example, power quality meters display and record values and minimum and maximum extremes, but even if a parameter is within the prescribed range, it does not necessarily follow that all is well. Furthermore, attempts to predefine acceptable power quality levels fails to acknowledge unique attributes of a particular site in an electrical system. In one computer implemented system, the triggers are dynamically adjusted to achieve a desired rate of events. In practice, the method results in bursts of events that are not very extraordinary as the threshold is set just above nominal and is therefore, very sensitive. Furthermore, the user is still not aware of whether the conditions are normal even though the parameters may be within the dynamically adjusted ranges.

SUMMARY OF THE INVENTION

Statistically derived dynamic thresholds are used to define existing normal conditions at a monitoring site in an electric power distribution system.

In accordance with one aspect of the invention, parameters in an electric power distribution system are monitored by measuring a selected parameter of the electric power distribution system repetitively to generate measured values of the selected parameter. The standard deviation of the measured values is determined periodically and at least one threshold for the measured values is periodically established as a function of the standard deviation. An output is generated relating the measured values to the at least one threshold. The selected parameter can be measured repetitively by taking multiple samples of the selected parameter over a selected interval and generating the measured value as a function of the multiple samples, such as an average function of the multiple samples.

The standard deviation of the measured values can be determined in various ways. For instance, a histogram or distribution curve can be developed with the standard deviation being approximated by the point at which 32% of the samples are outside of the center of distribution. As another example, an averaging filter can be utilized to estimate the standard deviation. Thus, the standard deviation can be generated by periodically generating a long-term average of the measured values and using the long-term average to generate the standard deviation. Where the desired long-term for generating the average would take an unacceptably long time to produce results, a first moving average with the measured value over a first time period can be generated followed by the generation of a second moving average over a second time period which is a multiple of the first time period using multiples of the first moving average. The long-term average can then be generated using only the first moving average initially, then building up to the second moving average using multiples of the first moving average until the method has been employed for the second time period, and thereafter using the second moving average as the long-term average.

In accordance with another aspect of the invention, the at least one dynamic threshold is generated by adding a multiple times the standard deviation to this long-term average. This multiplier for example, can range from about three to six. As another aspect of the invention, a low dynamic threshold can be generated with a negative multiplier and a high dynamic threshold generated with a positive multiplier. Alternatively, a first dynamic threshold of about three times the standard deviation can be used to provide a caution and a second dynamic threshold of about six times the standard deviation can be used to generate an alarm and/or an action when the measured value reaches this second dynamic threshold.

The method can be applied wherein the selected parameter is selected from a list comprising: volts, amps, vars, watts, VA, power factor, total harmonic distortion in the current, total harmonic distortion in the voltage, flicker, and frequency.

Another aspect of the invention is directed to a monitoring system for monitoring an electric power distribution system, which comprises: a sensor sensing conditions in the power distribution system; processing means generating from sensed conditions measured values of a selected parameter and periodically generating a standard deviation of the measured values and at least one dynamic threshold for the measured values using the standard deviation; and output means generating an output relating the measured values to the at least one dynamic threshold. The processing means can comprise means generating a long-term average of the measured values and generating a low dynamic threshold by subtracting a function of the standard deviation from the long-term average and generating a high dynamic threshold by adding the function of the standard deviation to the long-term average. The processing means can generate samples of the selected parameter over a selected interval and generate the measured values as an average of the samples over the selected interval. Also, the processing means can generate a long-term average of the measured values and the at least one dynamic threshold by adding a multiplier times the standard deviation to the long-term average. The multiplier can be positive to generate a high dynamic threshold and negative to generate a low dynamic threshold. In addition, the multiplier can have a first value to generate a first dynamic threshold at which a caution is generated, and a second, larger multiplier to generate a second dynamic threshold at which an alarm and/or an action is taken.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
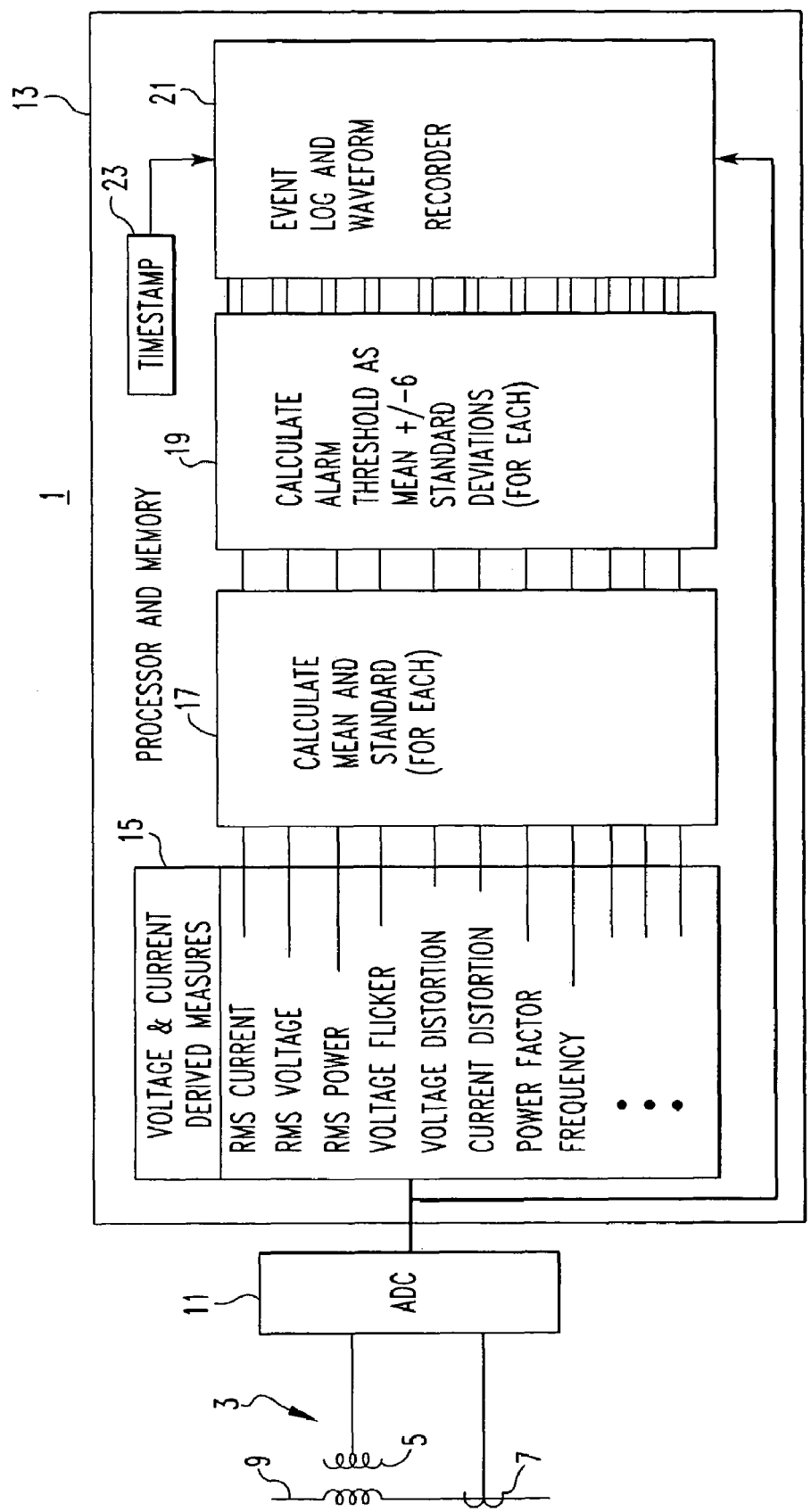
FIG. 1 is a schematic diagram of a monitoring system in accordance with the invention.

The invention is directed to a method and monitor that provide an indication of power quality in an electric power distribution system as represented by selected parameters based upon what is normal for the monitored location. As the absolute definition of normal varies from site to site, a statistical mean is used to define normal. In particular, normal is defined using a number of standard deviations. When an event occurs that is beyond the normal condition, that event is automatically captured. Thus, referring to FIG. 1, the monitor 1 includes sensors 3 such as potential transformers 5 and current transformers 7 that measure voltage and current, respectively, in the monitored electric power distribution system 9. While a single line representation is used for clarity, typically the electric power distribution system 9 would be a three-phase system, and hence, there would be a potential transformer 5 and current transformer 7 for each phase. The sensed currents and voltages are digitized by an analog-to-digital converter 11 for input to the processor 13.

The sensed values of current and voltage in the electric power distribution system 9 are used to generate measured values of selected parameters, some of which are calculated. Exemplary selected parameters include RMS current, RMS voltage, RMS power (watts), RMS reactive power (vars), VA, power factor, total harmonic distortion in current, total harmonic distortion in voltage, flicker, and frequency. Additional and/or other parameters could also be processed. These measured values are derived in a module 15 within the processors 13. The processor 13 also includes a module 17 that calculates a mean and a standard deviation for each of the selected parameters. An additional module 19 generates at least one dynamic threshold as a function of the standard deviation for each of the selected parameters. Depending upon the application and the preferences of the user, the dynamic threshold can be set at a selected multiplier times the standard deviation. Selecting a multiplier of 6, that is 6σ to set the dynamic threshold provides a response in which only truly abnormal events will cause a parameter to reach the threshold. For some parameters, a high and low dynamic threshold can be set using a positive multiplier times the standard deviation and a negative multiplier times the standard deviation, respectively. For instance, dynamic thresholds could be set at +6σ and −6σ. Also, different levels of dynamic threshold can be established. Thus, for instance, a first dynamic threshold can be set at 3σ to provide a caution indication before the second dynamic threshold, such as 6σ, is reached. Of course, there could be multiple levels of positive and negative dynamic thresholds.

Returning to FIG. 1, there is also an output module 21 that generates an output response when the measured value of the parameter reaches a threshold. As mentioned above, this output response could include a caution, an alarm, and/or an action such as logging of the event with or without waveform capture or recording. Other actions could also be initiated such as even interrupting current in the power distribution system. As indicated at 23, the event log could include a time stamp 23 to provide a historical record for analysis.

Figure 2:
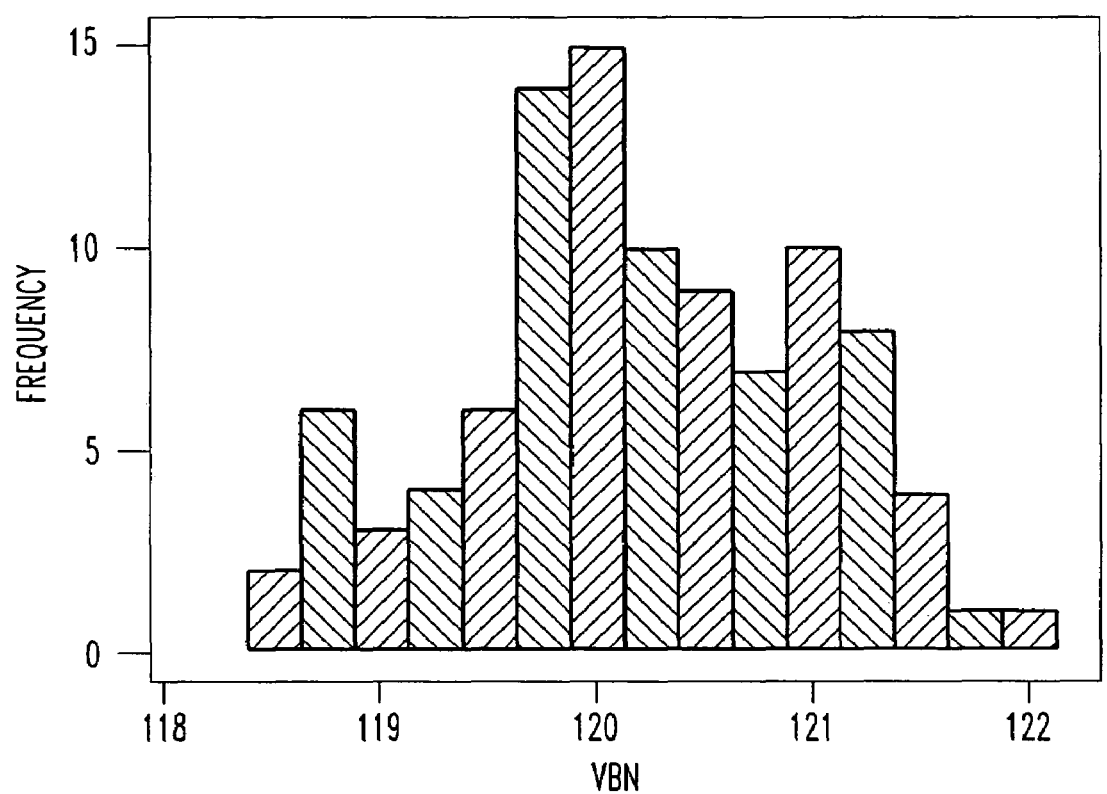
FIG. 2 is an exemplary histogram illustrating values of voltage recorded using the invention.

The standard deviation for the measured values of a selected parameter can be approximated in several ways. FIG. 2 illustrates use of a histogram 25 in which periodic measured values of the selected parameter are plotted. In the example, 100 values of the phase B to neutral voltage (VBN) are plotted. The standard deviation is determined at the point at which 32% of the samples are outside of the center distribution. In the example, VBN has a mean value of 120.20 V and a standard deviation of 0.81. Thus 3σ is 2.43 and 6σ is 4.86. Hence, a trigger set for 6σ has thresholds at 120.2+/−, 4.86 V so that the lower threshold is 115.34 V and the upper threshold is 125.06 V. The 3σ thresholds would be at 117.77 and 122.63 V.

The standard deviation of each selected parameter can alternatively be estimated with an averaging filter. By using a moving average, normal changes in the distribution system, such as through aging, can be accommodated. The longer the long-term average, the more stable will be the results. In the exemplary monitor and method, a period of one year is selected for the long-term average. However, as this requires gathering a full year of statistics, a two stage averaging is utilized. Accordingly, a first long-term average which is a first moving average of the measured values taken over a first time period is used to generate the second moving average over the second time period which is a multiple of the first time period. In the example, the first time period is one week and the second time period is the one year. Thus, statistics gathered over weekly periods are used during the first year to calculate the standard deviation. The same weekly statistics are then added weekly to calculation of the yearly running average after the first year of service.

In addition, in accordance with an aspect of the invention, the measured values for each of the selected parameters are repetitively generated by taking multiple samples of the selected parameter over a selected interval and then generating the measured value as a function of the multiple samples. In the exemplary monitor, samples generated during a ten minute interval are averaged to generate the measured value of each of the selected parameters.

In the example, the following Equation 1 is used to calculate the one-week moving average of the measured value, MV, of each of the selected parameters:

$$\mu_w = \frac{1}{1008}[1007\mu_{w-1} + MV] \qquad \text{Eq. (1)}$$

Data is calculated for 10-minute intervals, there being 1008 10-minute intervals in a week.

The weekly average for each parameter is then utilized to generate the second long-term mean, e.g., one-year moving average, using the following formula:

$$\mu_{avg} = \frac{1}{52}[51\mu_{avg} + \mu_w] \qquad \text{Eq. (2)}$$

These formulas, one and two, are used to generate the long-term mean for each of the selected parameters.

A moving average of the variance of the measured values is calculated by the formula:

$$\sigma_w^2 = \frac{1}{1008}[1007\sigma_{w-1}^2 + (MV - \mu_w)^2] \qquad \text{Eq. (3)}$$

A moving average of the standard deviation, which is the square root of the variance, over one year is calculated by the formula:

$$\sigma_{avg} = \frac{1}{52}[51\sigma_{avg-1} + \sigma_w] \qquad \text{Eq. (4)}$$

Figure 3A:
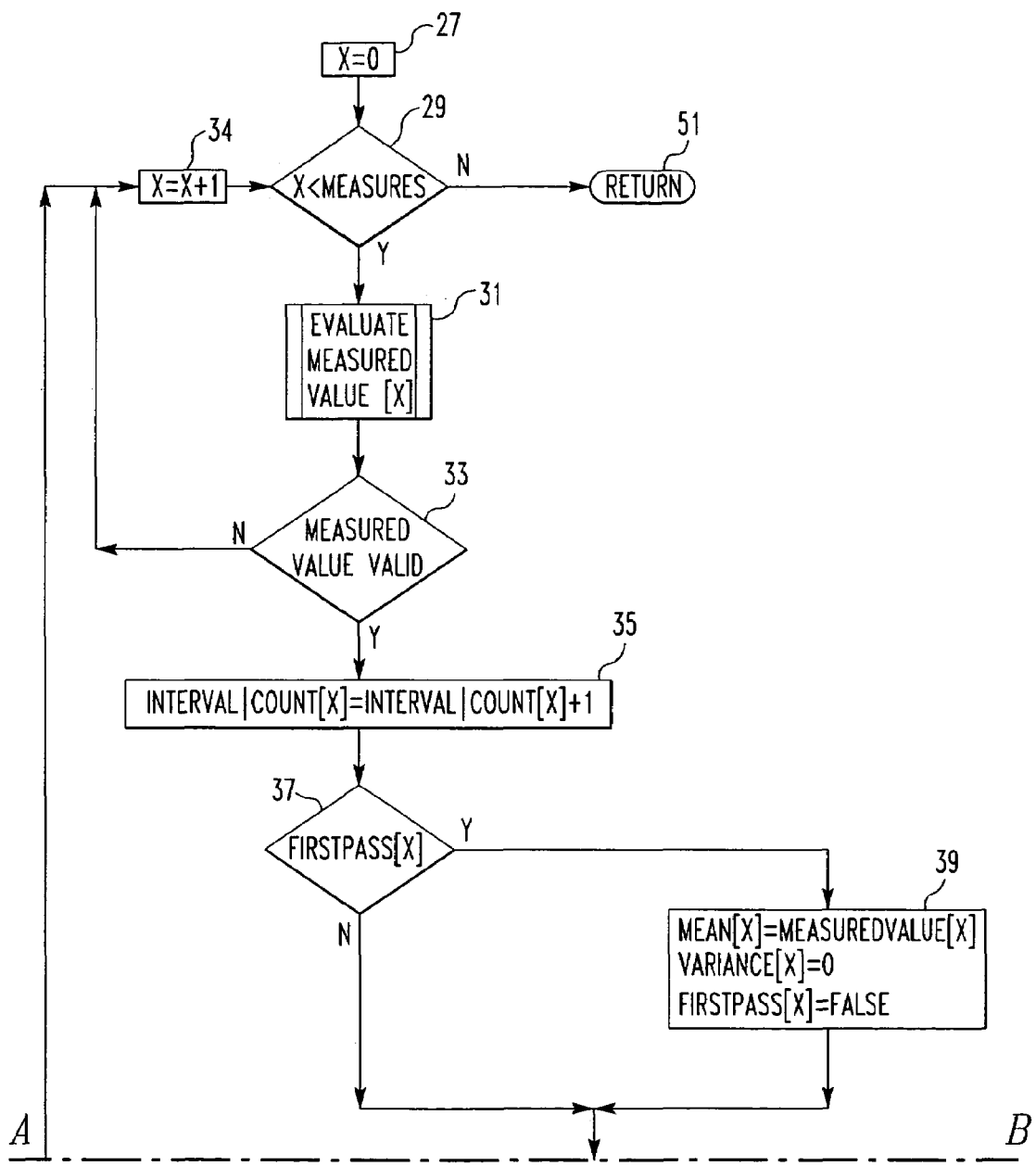
FIGS. 3A and 3B comprise a flowchart illustrating operation of the monitoring system of FIG. 1.
Figure 3B:
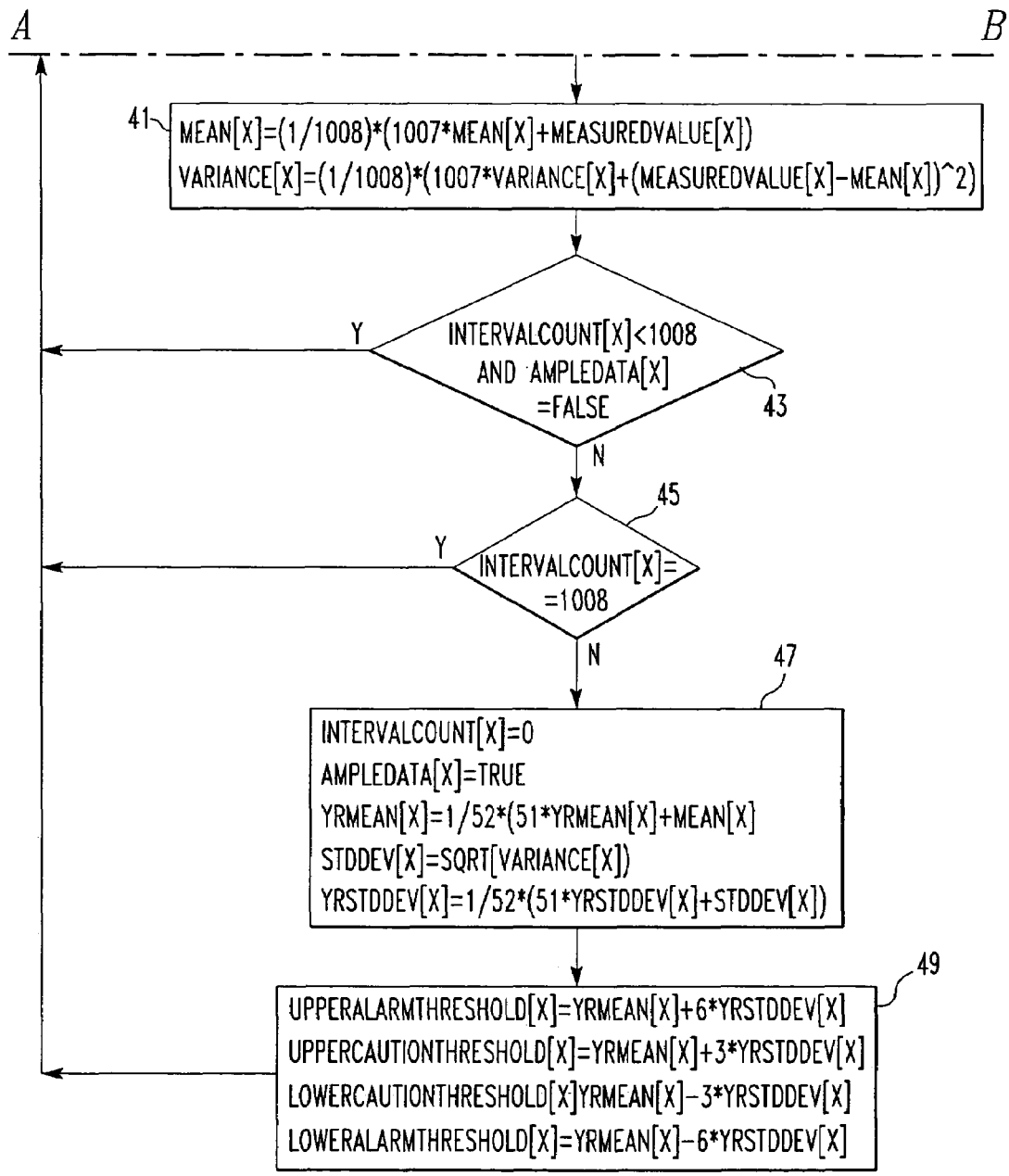

FIGS. 3A and 3B illustrate a flow chart 25 implemented by the processor 13 to calculate the long-term average, standard deviation and dynamic thresholds for each of the selected parameters. This routine 25 is run every 10 minutes using the measured values of the selected parameters calculated during the previous 10-minute interval as described above. The value x is the index for the selected parameters which is initially at zero as shown at 27. A loop is entered at 29 to process each of the parameters serially. Each parameter in sequence is evaluated at 31 to determine if the measured value is reasonable. If the measured value is not valid as determined at 33, for instance the voltage is below 30 volts, the program loops back and selects the next parameter at 34. If the measured value is valid at 33 then the interval count for that parameter is incremented at 35. If this is the first time through the routine for this parameter as determined at 37, the mean value is set at this first measured value, the variance is set to zero and a "first pass flag" is set to false all at 39 so that this pass is bypassed during subsequent passes. On the first pass and subsequent passes, the weekly mean and the variance are calculated at 41 using Equations 1 and 3. During the first week of operation, a flag "AMPLEDATA" will be false at 43 and until a week of data has been collected, i.e., the integral count reaches 1008, the program will loop back and process the measured value for the next parameter.

After a week of operation, when the interval count reaches 1008 at 43 and at 45, the program proceeds to 47 where the interval count for the selected parameter is set equal to zero and the "AMPLEDATA" flag is set to true. The year mean is then calculated using Equation 2, the standard deviation is calculated as the square root of the variance (Equation 3) and the year standard deviation is generated using Equation 4. Following this, the upper and lower $3\sigma$ and $6\sigma$ dynamic thresholds are generated at 49. When this has been completed, the routine loops back to 29 to select the next parameter. After the first week, when the "AMPLEDATA" flag is set to TRUE, the program will advance through block 43 to block 45 on each interval, and when a week's worth of measured values have been collected the means, standard deviations and dynamic thresholds will be recalculated at 47 and 49. During each run of the routine 25, when the measured values for all of the selected parameters have been processed as determined at 29, the program is exited at 51 awaiting the next 10 minute interval.

Figure 4:
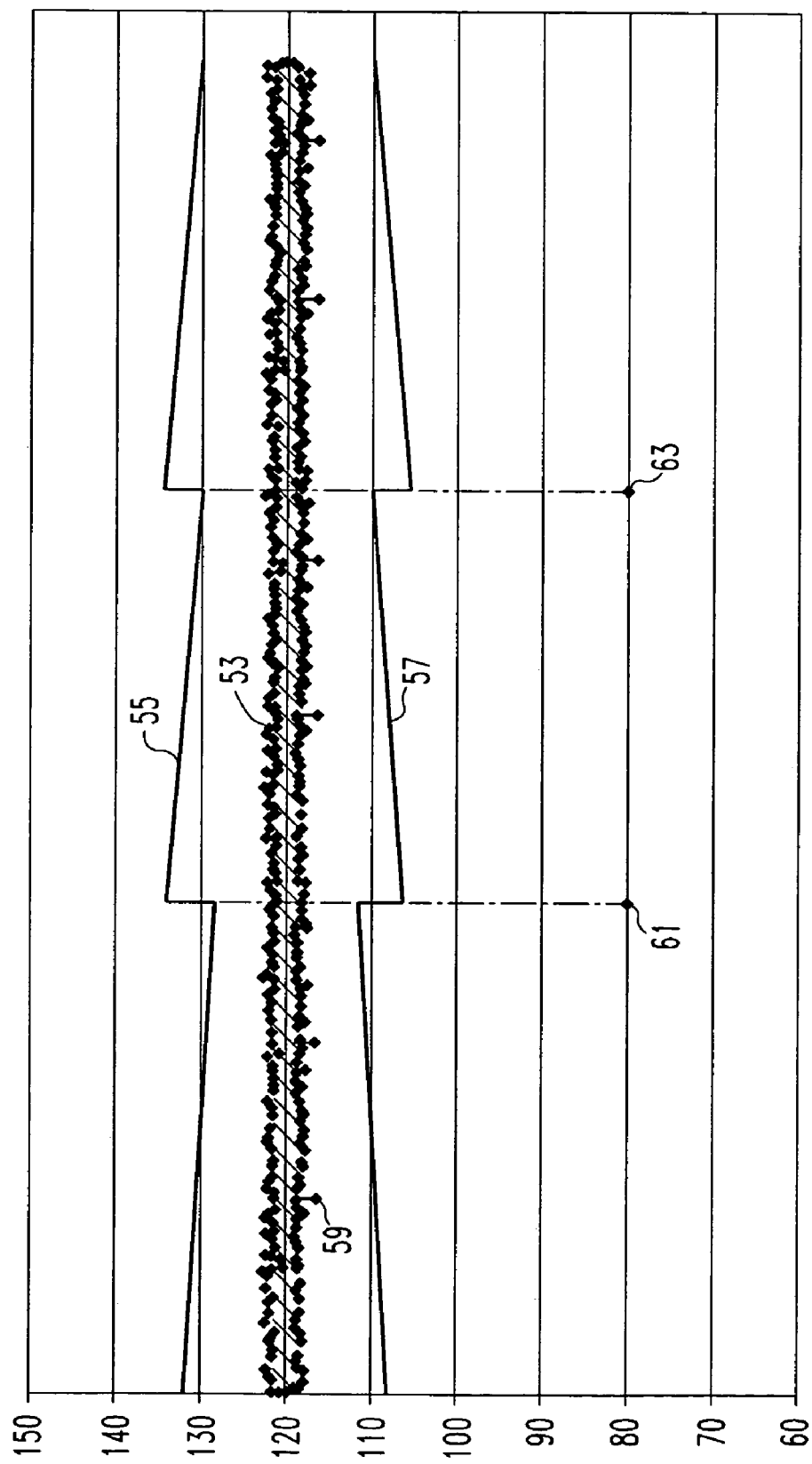
FIG. 4 illustrates dynamic adjustment of a trigger threshold in accordance with the invention.

FIG. 4 illustrates an example of the operation of the invention. In the example, the nominal voltage is 120V and the measured values are shown by the values 53. The $+6\sigma$ dynamic threshold is illustrated at 55 and the $-6\sigma$ dynamic threshold is shown at 57. The typical data varies from about 118V to about 122V, which are within $3\sigma$ of the norm, but there are a number of minor sags 59 at around 115V. Given this distribution, the system adjusts the dynamic thresholds to trigger on the alarming value levels, e.g., the $6\sigma$ dynamic thresholds. The data of FIG. 4 also shows the effects of a couple of power system faults 61 and 63 where the voltage falls to 80V. The immediate effect is that the trigger sensitivity is decreased by the widening of the normal range of the distribution, i.e., the upper and lower dynamic thresholds 55 and 57 widen. However, the system adapts to the situation and eventually the dynamic thresholds narrow. If these faults are frequent, they become part of the normal distribution, change the standard deviation, and therefore adjust the dynamic thresholds.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method for monitoring parameters in an electric power distribution system comprising the steps of:

measuring a selected parameter of the electric power distribution system repetitively to generate measured values of the selected parameter;

periodically determining the standard deviation of the measured values;

periodically establishing at least one dynamic threshold for the measured values as a function of the standard deviation;

generating an output relating the measured values to the at least one dynamic threshold;

wherein generating the at least one dynamic threshold is generated within a range of about three to about six times the standard deviation; and generating a first dynamic threshold at about three times the standard deviation and a second dynamic threshold at about six times the standard deviation.

2. The method of claim 1 wherein generating the output comprises generating a caution when the measured value reaches the first dynamic threshold and generating at least one of an alarm and an action when the measured value reaches the second dynamic threshold.

3. A method for monitoring parameters in an electric power distribution system comprising the steps of:

measuring a selected parameter of the electric power distribution system repetitively to generate measured values of the selected parameter;

periodically determining the standard deviation of the measured values;

periodically establishing at least one dynamic threshold for the measured values as a function of the standard deviation;

generating an output relating the measured values to the at least one dynamic threshold; and wherein the selected parameter is selected from a list comprising: volts, amps, vars, watts, VA, power factor, total harmonic distortion in the current, total harmonic distortion in the voltage, flicker, and frequency.

4. A monitoring system for monitoring an electric power distribution system, comprising:

a sensor sensing conditions in the electric power distribution system;

processing means generating from sensed conditions measured values of a selected parameter and periodically generating a standard deviation of the measured values and at least one dynamic threshold for the measured values using the standard deviation;

output means generating an output relating the measured values to the at least one dynamic threshold;
wherein the processing means comprises means generating a long-term avenge of the measured values, and means generating the at least one dynamic threshold by adding a multiplier times the standard deviation to the long-term avenge; and
wherein the means generating the at least one dynamic threshold generates a first dynamic threshold using a first multiplier and a second dynamic threshold using a second multiplier larger than the first multiplier, and wherein the output means generates a caution indication when the first dynamic threshold is reached by the measured values and generates at least one of a warning and an action when the second dynamic threshold is reached by the measured values.

* * * * *